(12) United States Patent
Itou

(10) Patent No.: US 8,283,020 B2
(45) Date of Patent: Oct. 9, 2012

(54) LAMINATE FILM AND COMPOSITE FILM

(75) Inventor: Shigehide Itou, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 248 days.

(21) Appl. No.: 12/862,396

(22) Filed: Aug. 24, 2010

(65) Prior Publication Data

US 2011/0052868 A1 Mar. 3, 2011

(30) Foreign Application Priority Data

Aug. 26, 2009 (JP) ................................ 2009-195234

(51) Int. Cl.
*B32B 17/10* (2006.01)
*B65C 9/18* (2006.01)

(52) U.S. Cl. ......... 428/141; 428/220; 428/216; 156/238

(58) Field of Classification Search .................. 428/141; 156/238

See application file for complete search history.

(56) References Cited

U.S. PATENT DOCUMENTS

| 2005/0238846 A1* | 10/2005 | Arakatsu et al. | 428/141 |
| 2010/0304106 A1* | 12/2010 | Takano et al. | 428/216 |
| 2011/0052893 A1* | 3/2011 | Oouchi | 428/216 |

FOREIGN PATENT DOCUMENTS

| JP | 6-340046 A | 12/1994 |
| JP | 2000-85067 A | 3/2000 |
| JP | 2000-227603 A | 8/2000 |
| JP | 2001-150584 A | 6/2001 |
| JP | 2002-26354 A | 1/2002 |
| JP | 2002-80616 A | 3/2002 |
| JP | 2003-60218 A | 2/2003 |
| JP | 2006-289627 A | 10/2006 |

OTHER PUBLICATIONS

European Search Report in European Application No. 10173974 mailed Nov. 17, 2010.

* cited by examiner

*Primary Examiner* — David Sample
*Assistant Examiner* — Tahseen N Khan
(74) *Attorney, Agent, or Firm* — Birch, Stewart, Kolash & Birch, LLP

(57) ABSTRACT

A laminate film having excellent barrier property is provided. The laminate film comprises a substrate film, an organic layer and an inorganic layer in that order, wherein the organic layer has a thickness of 300 nm to 2000 nm, the inorganic layer comprises silicon oxide represented by SiOx, wherein x is in a range from 0.9 to 1.5, and the organic layer has a surface satisfying Ra (100 μm square)<50 nm, Ra (10 μm square)<2 nm, and 75 nm<Rz (100 μm square)<300 nm.

20 Claims, 1 Drawing Sheet

LAMINATE FILM AND COMPOSITE FILM

FIELD OF THE INVENTION

The invention relates to a laminate film. The invention also relates to a composite film obtained by adhering to the laminate films to each other. In particular, the invention relates to a film preferably used for a back sheet of a solar cell.

BACKGROUND OF THE INVENTION

In recent years, a solar energy generation system is prevailing as a way of generating electricity utilizing clean energy. Solar cell modules are generally composed of three layers of a glass, a cell for a solar cell (a semiconductor cell) and a back sheet.

The back sheet protects the cell so as to avoid the degradation of the cell, thereby serving to maintain its generating efficiency. Such a back sheet is requested to have excellent mechanical property, heat resistance, and weatherability. JP-A 2002-26354 and JP-A-2003-60218, for example, disclose a protective film for the back side of a solar cell using a polyethylene terephthalate film.

Solar cells are requested to have high barrier property since those are put in outdoors for long years. As a result, it is investigated to use a laminate film in which an organic layer and an inorganic layer are laminated on a substrate film. In order to produce such a laminate film at low cost, a roll to roll processing which can produce a large-area film at high speed is chosen. When the laminate film is produced by the roll to roll processing, its important factor is its friction and slidability between a substrate film and a pass roller in transferring the substrate film at high speed, or its friction and slidability of laminated layers. That is, the film must be optimized in slidability. When the laminate film is poor in slidability, wrinkle often occurs in transferring or taking-up the film, and therefore, the slidability is highly demanded.

JP-A-2000-85067 discloses that the film satisfying a particular Ra is excellent in handability such as stickiness and the like and in hydrothermal resistance of the vapor-deposited layer. On the other hand, JP-A-6-340046 discloses that a film excellent in adhesiveness and slidability is obtained by adjusting prominence of the film.

SUMMARY OF THE INVENTION

The inventor has investigated the film disclosed in JP-A-2000-85067 and found out that the film disclosed in JP-A-2000-85067 is effective for handability such as stickiness and the like and hydrothermal resistance of the deposited layer but not enough for its slidability, and therefore, in the case of producing by roll to roll processing, problems such as wrinkle often are caused. In addition, the film disclosed in JP-A-6-340046 can not achieve the barrier property that solar cells require.

An object of the invention is to solve the above problems, and is to provide a laminate film which has slidability and sufficient barrier property and which is used for a back sheet of a solar cell.

In order to ensure slidability of a film, it is generally known that fine particles which are called as a matting agent are added into the film. Such a film comprising fine particles, however, has a rough surface. When an inorganic layer is formed on such a rough surface thereof, the inorganic layer becomes to have less denseness, which leads to decreased barrier property. Therefore, in general, an organic layer is formed on a rough surface thereof in order to smooth the surface. When such an organic layer is formed, the inorganic layer formed thereon becomes dense, thereby improving the barrier property of the laminate film. However, the slidability of the laminate film decreases.

Under such situation, it has been found out that a laminate film which comprises a substrate film, an organic layer and an inorganic layer in that order, which has a dense inorganic layer, and which has a desired slidability can be formed by providing large wave on a surface of the organic layer and removing small wave from the surface of the organic layer. Specifically, the above problems have been solved by adjusting a surface of the organic layer to satisfy prescribed Ra and Rz and adjusting the thickness of the organic layer to have a prescribed thickness. Therefore, the invention has been completed.

Specifically, the aforementioned problem can be solved by the following means.

(1) A laminate film comprising a substrate film, an organic layer and an inorganic layer in that order, wherein the organic layer has a thickness of 300 nm to 2000 nm, the inorganic layer comprises silicon oxide represented by SiOx, wherein x is in a range from 0.9 to 1.5, and the organic layer has a surface satisfying all the following formulae;

$Ra(100 \mu m\ square) < 50\ nm$ $Ra(10 \mu m\ square) < 2\ nm$ $75\ nm < Rz(100 \mu m\ square) < 300\ nm$.

(2) The laminate film according to (1), wherein the substrate film has a surface satisfying all the following formulae;

$Ra(100 \mu m\ square) < 50\ nm$ $300\ nm < Rz(100 \mu m\ square) < 1200\ nm$.

(3) The laminate film according to (1) or (2), wherein the organic layer is obtained by curing a polymerizable composition comprising a (meth)acrylate.

(4) The laminate film according to (1) or (2), wherein the organic layer is obtained by curing a polymerizable composition comprising a polyfunctional (meth)acrylate.

(5) The laminate film according to (1) or (2), wherein the organic layer is obtained by curing a polymerizable composition comprising a polyfunctional (meth)acrylate having an aromatic carbon skeleton.

(6) The laminate film according to any one of (1) to (5), wherein the substrate film comprises fine particles dispersed therein.

(7) The laminate film according to (6), wherein the fine particles comprise one or more kinds selected from silicon oxide, titanium oxide and zirconium oxide.

(8) The laminate film according to (6), wherein the fine particles comprise carbon black.

(9) The laminate film according to any one of (1) to (8), wherein the substrate film comprises a colorant.

(10) The laminate film according to any one of (1) to (9), wherein the organic layer comprises a silane coupling agent.

(11) The laminate film according to any one of (1) to (10), wherein the inorganic layer comprises silicon oxide and/or aluminium oxide.

(12) The laminate film according to any one of (1) to (11), wherein the inorganic layer is a layer formed by a vacuum deposition method.

(12-2) The laminate film according to any one of (1) to (12), wherein the inorganic layer is a layer formed by a plasma-assisted deposition method.

(13) A composite film comprising two laminate films, wherein the two laminate films each are the laminate film according to any one of (1) to (12-2) and adhere to each other at a side of its inorganic layer.

(14) A back sheet for a solar cell comprising the laminate film according to any one of (1) to (12-2) or the composite film according to (13).

(15) A method for producing a laminate film according to any one of (1) to (12-2), comprising transferring the substrate film by roll to roll processing.

The invention makes it possible to provide a laminate film having slidability and sufficient barrier property.

DESCRIPTION OF SPECIFIC EMBODIMENTS

Figure 1:
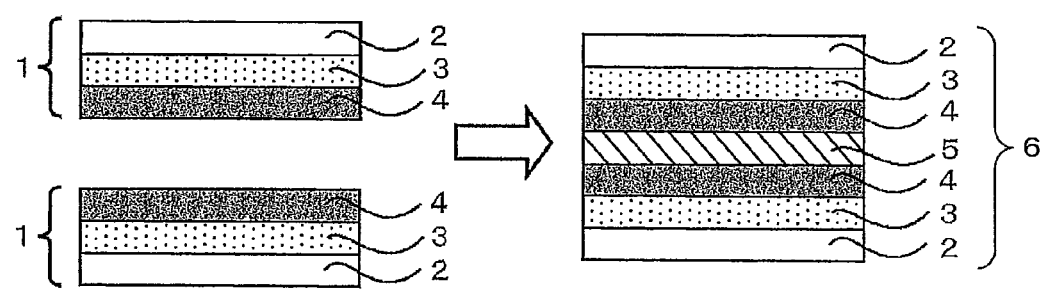
FIG. 1 is a diagrammatic illustration showing that two laminate films are stuck together to form a composite film, wherein 1 is a laminate film, 2 is a substrate film, 3 is an organic layer, 4 is an inorganic layer, 5 is an adhesive layer, and 6 is a composite film.

The contents of the invention are described in detail hereinunder. In this description, the numerical range expressed by the wording "a number to another number" means the range that falls between the former number indicating the lowermost limit of the range and the latter number indicating the uppermost limit thereof. "Organic EL device" as referred to herein means an organic electroluminescent device. In addition, "(meth)acrylate" means acrylate and methacrylate in the present specification.

The laminate film of the invention comprises a substrate film, an organic layer and an inorganic layer in that order, wherein the organic layer has a thickness of 300 nm to 2000 nm, the organic layer has a surface satisfying all the following formulae, and the inorganic layer comprises a silicon oxide represented by SiOx, wherein x is in a range from 0.9 to 1.5;

$Ra(100\ \mu m\ square) < 50\ nm$ $Ra(10\ \mu m\ square) < 2\ nm$ $75\ nm < Rz(100\ \mu m\ square) < 300\ nm$ By setting the surface of the organic layer to satisfy the above, occurrence of wrinkle and coil tightness in the laminate film are effectively reduced and high barrier property of the laminate film is achieved, even if the laminate film is transferred by roll to roll processing.

In the invention, the substrate film and the organic layer are generally adjacent to each other. In the invention, a surface of the organic layer adjacent to the inorganic layer preferably satisfies all the above formulae.

Ra in the specification means arithmetic average roughness, which is obtained by measuring a standard length between a point of a roughness profile and a point of the mean line which is vertically-extended from the point of a roughness profile, and adding up absolute values of deviation of the lengths to calculate their average value. Rz in the specification means ten-point arithmetic average roughness, which is obtained by measuring a standard length between a point of a roughness profile and a point of the mean line which is vertically-extended from the point of a roughness profile, and adding up the following averages (1) and (2);

(1) average value of absolute values of heights from the highest peak to the fifth highest peak;

(2) average value of absolute values of heights from the lowest valleys to the fifth lowest valleys.

Ra (100 μm square) means Ra in 100 μm square, Ra (10 μm square) means Ra in 10 μm square. Similarly, Rz (100 μm square) means Rz in 100 μm square.

The surface of the organic layer preferably satisfies each of the following formulae;

$20\ nm < Ra(100\ \mu m\ square) < 40\ nm$ $0.5\ nm < Ra(10\ \mu m\ square) < 1.0\ nm$ $100\ nm < Rz(100\ \mu m\ square) < 250\ nm$ Furthermore, in the invention, the surface of the substrate film preferably satisfies all the following formulae in the invention;

$Ra(100\ \mu m\ square) < 50\ nm$ $300\ nm < Rz(100\ \mu m\ square) < 1200\ nm$

By setting the surface of the substrate film to satisfy the above, occurrence of wrinkle and coil tightness of the laminate film are effectively reduced even if the laminate film is produced by roll to roll processing.

The surface of the substrate film further more preferably satisfies each of the following formulae;

$20\ nm < Ra(100\ \mu m\ square) < 40\ nm$ $400\ nm < Rz(100\ \mu m\ square) < 700\ nm$ (Organic Layer)

The organic layer of the invention is not specifically limited without deviating the scope of the invention, and is preferably a layer obtained by curing a polymerizable composition comprising a (meth)acrylate, more preferably a layer obtained by curing a polymerizable composition comprising a polyfunctional (meth)acrylate, further more preferably a layer obtained by curing a polymerizable composition comprising a polyfunctional (meth)acrylate having an aromatic carbon skeleton. Using a (meth)acrylate having an aromatic carbon skeleton is preferable since that tends to improve coatability of the substrate film and to improve the barrier property of the laminate film.

Examples of the aromatic carbon skeleton include benzene skeleton, biphenyl skeleton, naphthalene skeleton, binaphthyl skeleton, azulene skeleton, biphenylene skeleton, acenaphthylene skeleton, phenanthrene skeleton, anthracene skeleton, triphenylene skeleton, pyrene skeleton, chrysene skeleton, naphthacene skeleton, picene skeleton, perylene skeleton, and benzopyrene skeleton.

The aromatic carbon skeleton in the invention preferably has one or more aromatic rings, more preferably two or more aromatic rings. By employing a resin comprising an aromatic carbon skeleton having one or more aromatic rings, a layer which is more resistant to decomposition during plasma process can be formed. As a result, the barrier property of the laminate tends to be improved.

Also, the resin in the organic layer in the invention is preferably a resin having a three dimension cross-linking performance. Use of such a resin makes a denser organic layer.

The (meth)acrylates preferably used in the invention are exemplified below, to which, however, the invention is not limited thereto.

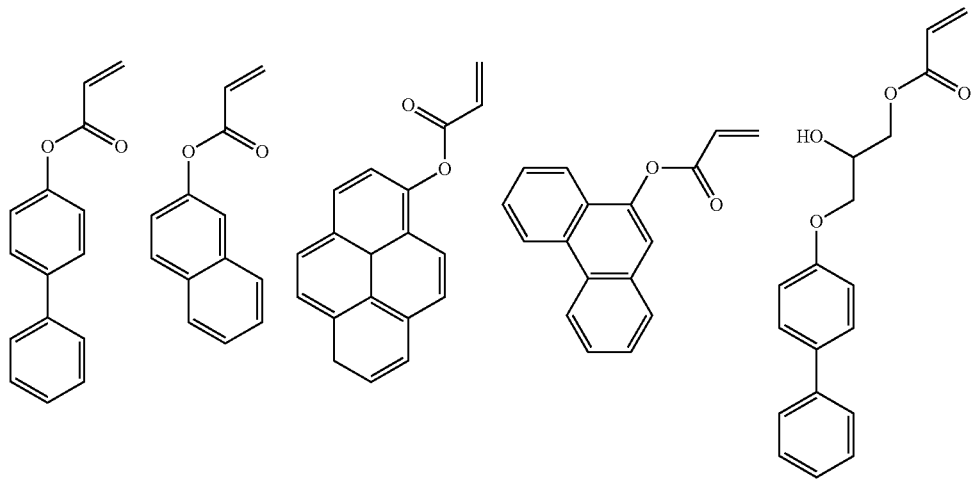
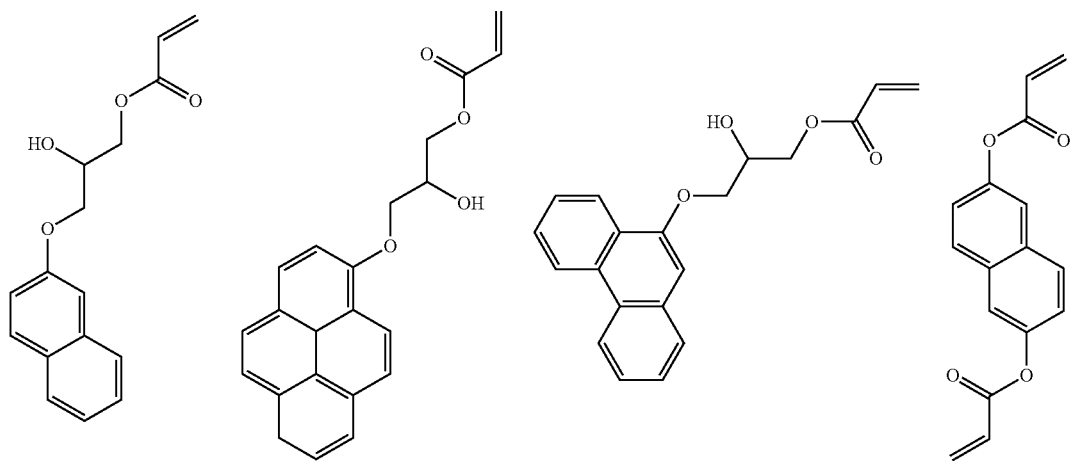
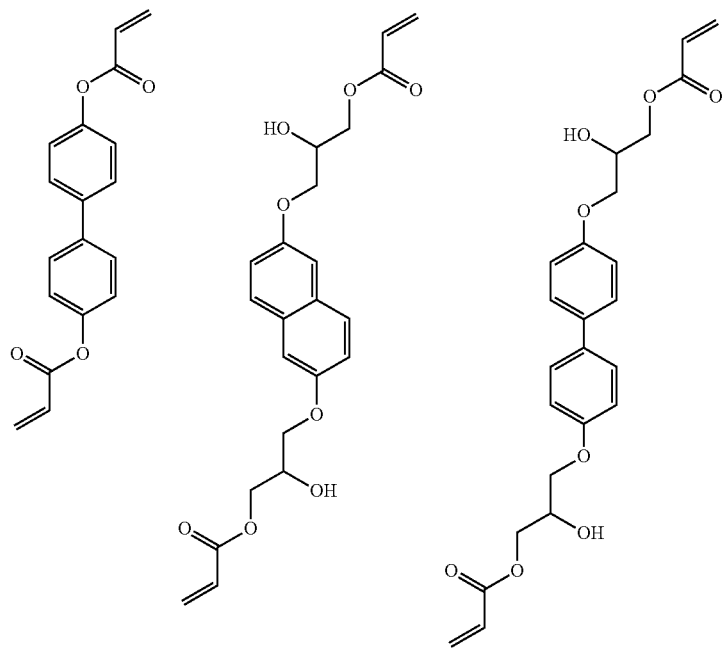

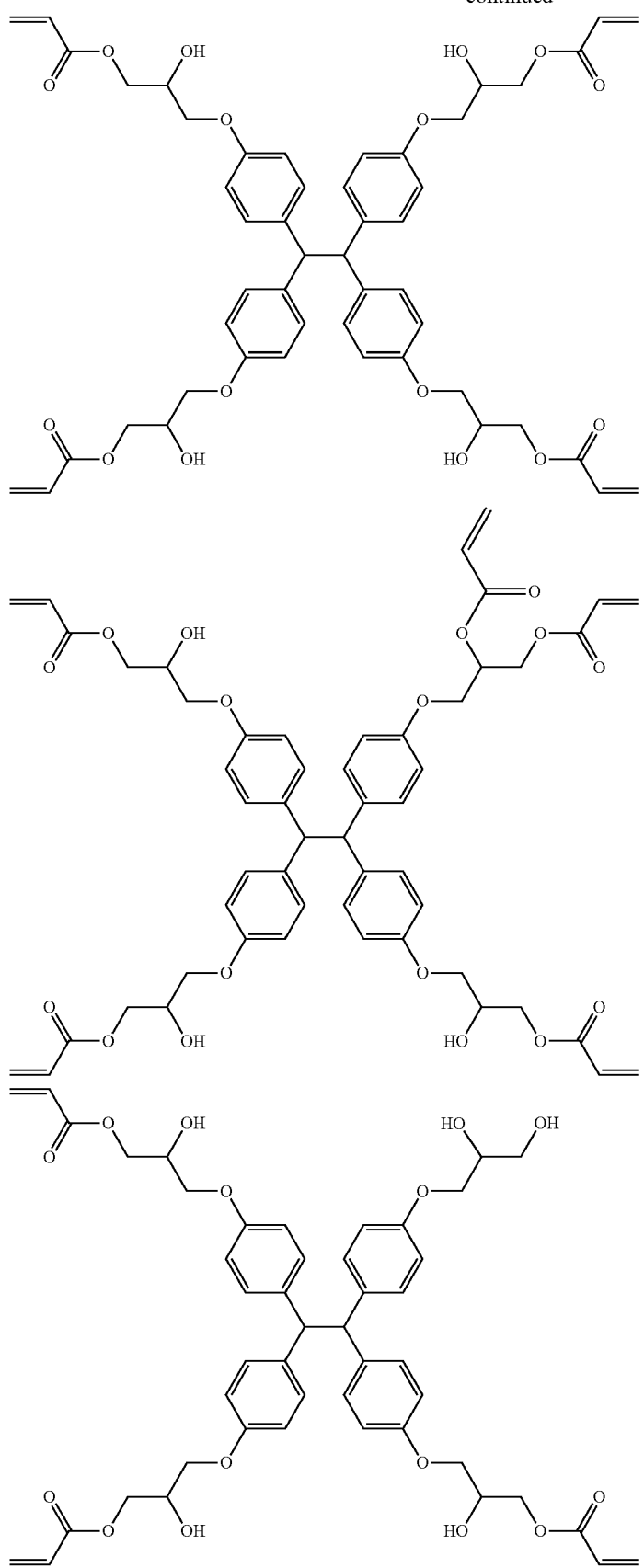

-continued
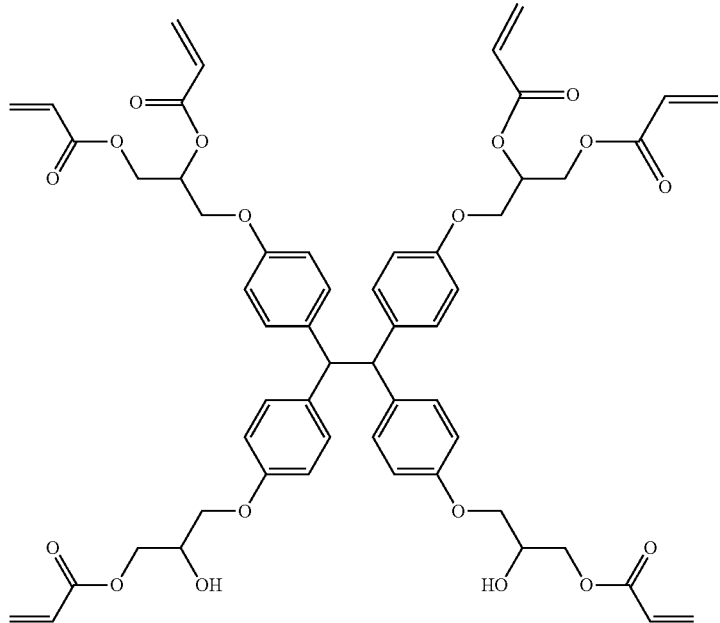
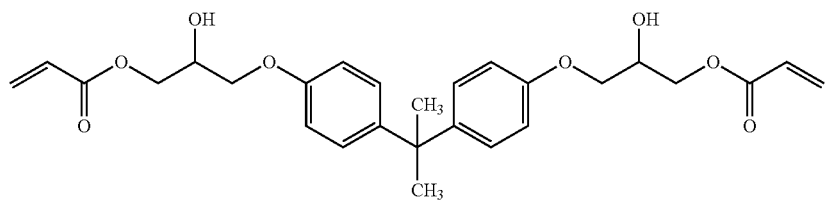
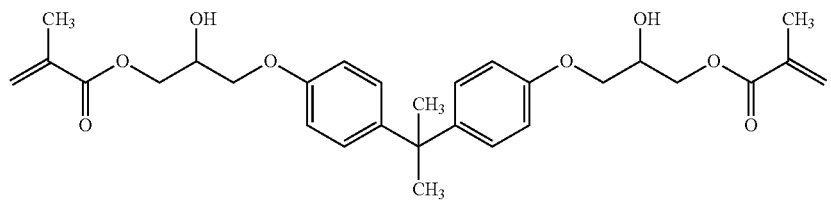
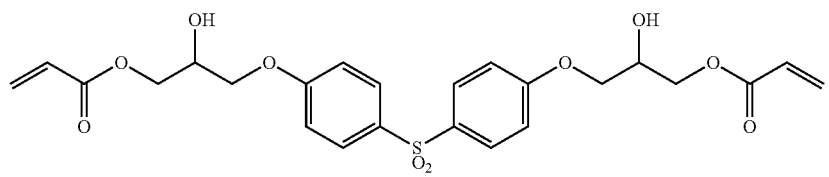
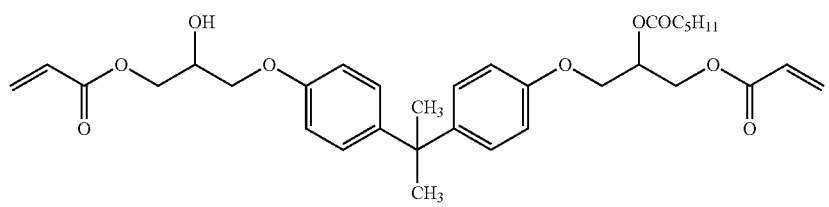

-continued
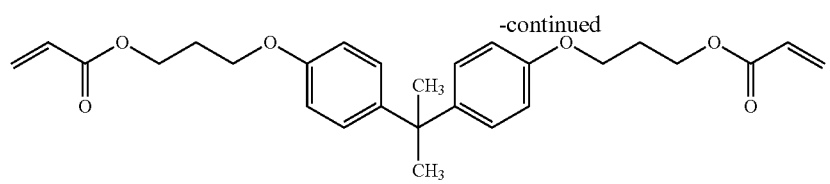
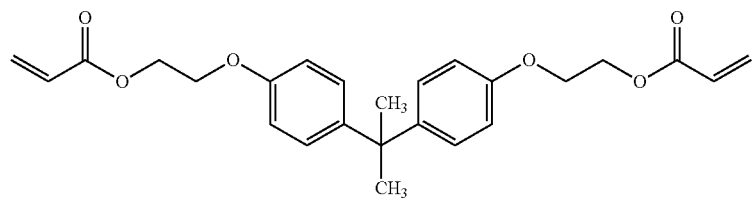
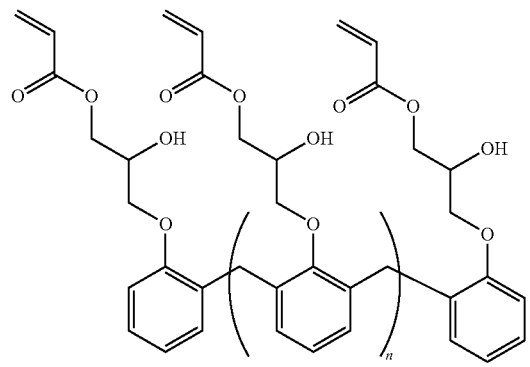
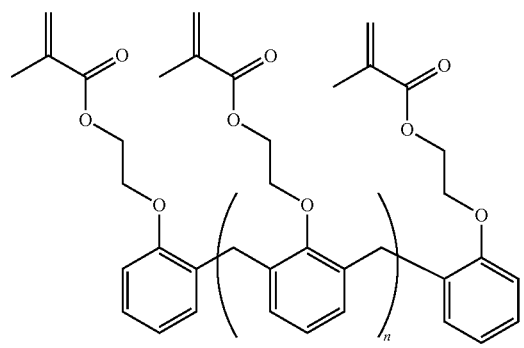
n is an integer
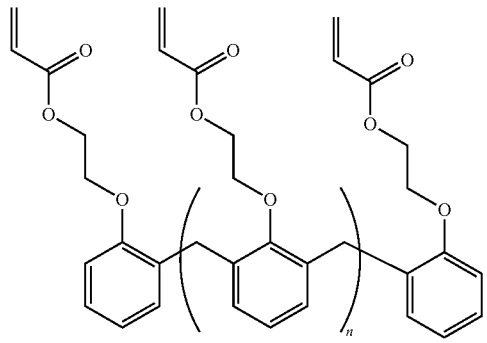
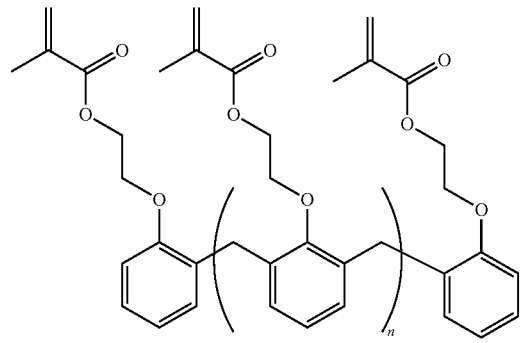
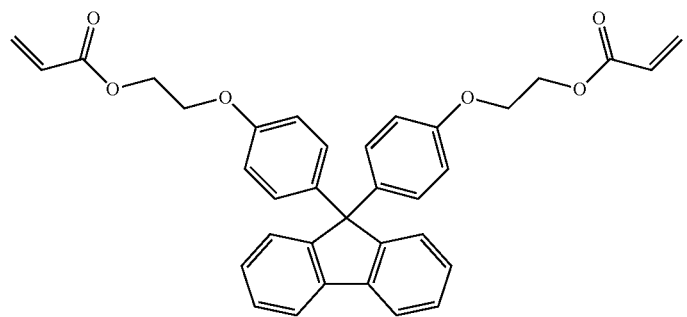

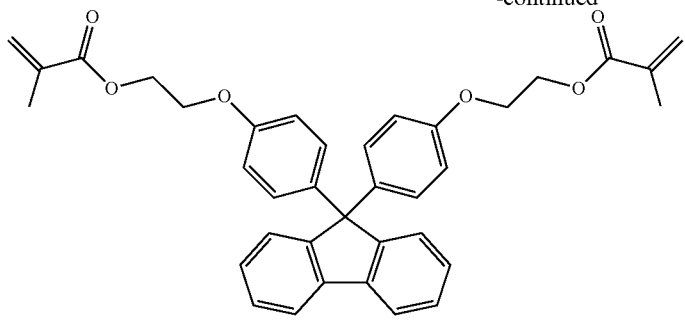
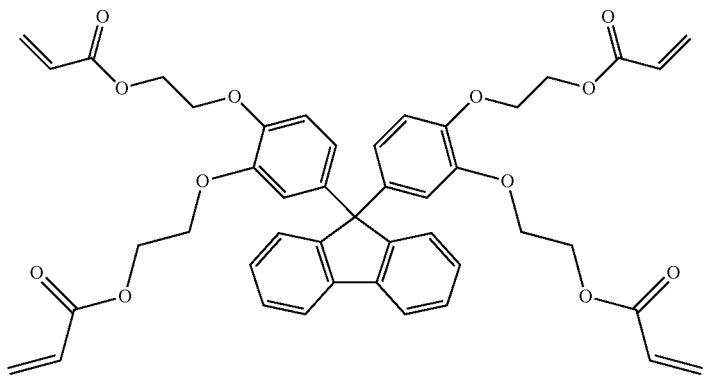
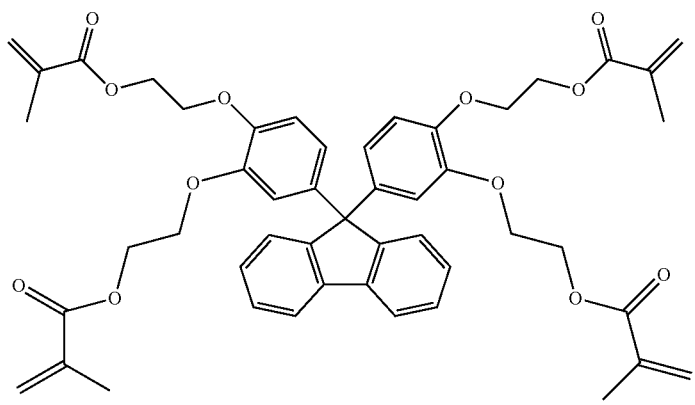
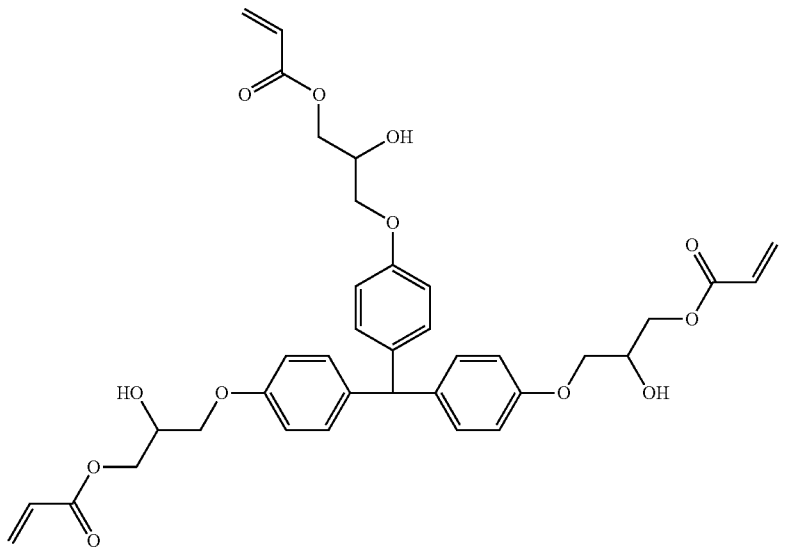

-continued

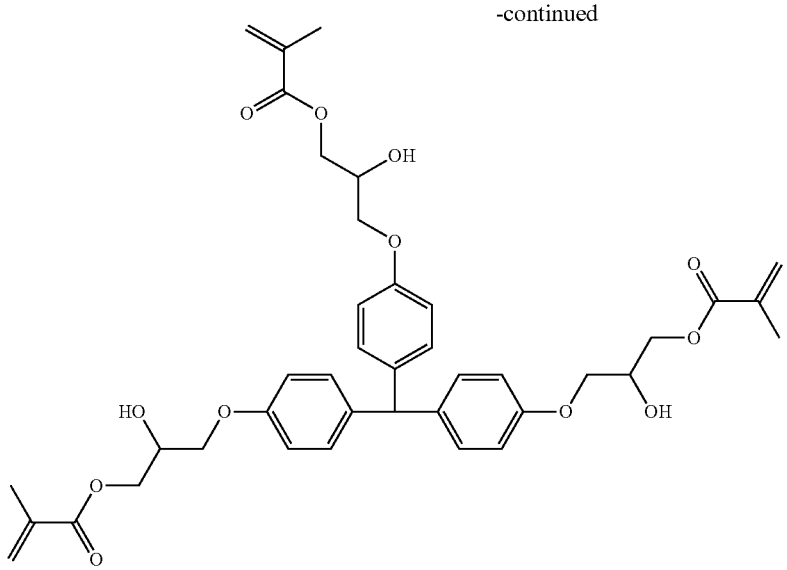

The organic layer in the invention is preferably obtained by curing a polymerizable composition comprising a polymerizable compound as mentioned above and a polymerization initiator. In the polymerizable composition, the content of a (meth)acrylate having an aromatic carbon skeleton in the polymerizable compound ingredient is preferably 50 to 100% by weight.

The polymerizable composition may comprise another polymerizable monomer in addition to the above polymerizable compounds without diverting the scope of the invention. The other polymerizable monomer is exemplified by a (meth) acrylate not having an aromatic carbon skeleton.

The organic layer preferably comprises a silane coupling agent. Use of the silane coupling agent improves adhesiveness between the substrate film and the organic layer and adhesiveness between the organic layer and the inorganic layer, and therefore, it is possible to reduce degradation of the barrier property based on peeling failure. The amount of the silane coupling agent to be added in the organic layer is preferably 5 to 30% by weight, more preferably 10 to 25% by weight. By adjusting such a range, both of the high barrier property and the excellent adhesiveness are achieved. The silane coupling agent used in the invention is not particularly limited, and it is exemplified by KBM-5103 manufactured by Shin-Etsu Chemical.

(Polymerization Initiator)

In the case where a photopolymerization initiator is used in the invention, its amount is preferably at least 0.1 mol % of the total amount of the polymerizing compound, more preferably from 0.5 to 2 mol %. By setting the thus-designed composition, polymerization reaction though an active ingredient forming reaction may be suitably controlled. Examples of the photopolymerization initiator include Ciba Speciality Chemicals commercial products, Irgacure series (e.g., Irgacure 651, Irgacure 754, Irgacure 184, Irgacure 2959, Irgacure 907, Irgacure 369, Irgacure 379, Irgacure 819), Darocure series (e.g., Darocure TPO, Darocure 1173), Quantacure PDO; Lamberti's commercial products, Ezacure series (e.g., Ezacure TZM, Ezacure TZT, Ezacure KT046), etc.

(Forming Method of Organic Layer)

The forming method of the organic layer is not specifically limited, and however, it is exemplified by a solution coating method or a vacuum film forming method.

In the invention, the composition comprising the polymerizable monomer is generally cured by irradiation. The light for irradiation is generally a UV ray from a high-pressure mercury lamp or low-pressure mercury lamp. The radiation energy is preferably at least 0.1 J/cm$^2$, more preferably at least 0.5 J/cm$^2$. (Meth)acrylate series compounds used in the invention may suffer from interference in polymerization owing to oxygen in air, and therefore, in their polymerization, the oxygen concentration or the oxygen partial pressure is preferably lowered. In the case where the oxygen concentration in polymerization is lowered according to a nitrogen purging method, the oxygen concentration is preferably not more than 2%, more preferably not more than 0.5%. In the case where the oxygen partial pressure in polymerization is lowered by a pressure reduction method, the whole pressure is preferably not more than 1000 Pa, more preferably not more than 100 Pa. Especially preferred is UV polymerization with at least 0.5 J/cm$^2$ energy radiation under a condition of reduced pressure of not more than 100 Pa.

The thickness of the organic layer in the laminate film of the invention is 300 nm to 2000 nm, preferably 500 to 1500 nm, more preferably 750 to 1250 nm. By adjusting such a range, the optimal surface for the organic layer achieving high barrier property and appropriate slidability is obtained.

(Substrate Film)

In the laminate film of the invention, the substrate film is generally a plastic film. Not specifically defined in point of the material and the thickness thereof, the plastic film usable herein may be any one capable of supporting a laminate film of an organic layer and an inorganic layer; and it may be suitably selected depending on the use and the object thereof. Concretely, the plastic film includes thermoplastic resins such as polyester resin, methacryl resin, methacrylic acid-maleic anhydride copolymer, polystyrene resin, transparent fluororesin, polyimide, fluoropolyimide resin, polyamide resin, polyamidimide resin, polyetherimide resin, cellulose acylate resin, polyurethane resin, polyether ether ketone resin, polycarbonate resin, alicyclic polyolefin resin, polyarylate resin, polyether sulfone resin, polysulfone resin, cycloolefin copolymer, fluorene ring-modified polycarbonate resin, alicyclic-modified polycarbonate resin, fluorene ring-modified polyester resin, acryloyl compound.

In case where the laminate film of the invention is used for an application requesting heat-resistance, it is desirable that the plastic film is formed of a heat-resistant material. Concretely, the plastic film is preferably formed of a heat-resistant transparent material having a glass transition temperature (Tg) of not lower than 100° C. and/or a linear thermal expansion coefficient of not less than 40 ppm/° C. Tg and the linear expansion coefficient may be controlled by the additives to the material. The thermoplastic resin of the type includes, for example, polyethylene naphthalate (PEN: 120° C.), polycarbonate (PC: 140° C.), alicyclic polyolefin (e.g., Nippon Zeon's Zeonoa 1600: 160° C.), polyarylate (PAr: 210° C.), polyether sulfone (PES: 220° C.), polysulfone (PSF: 190° C.), cycloolefin copolymer (COC, compound described in JP-A 2001-150584: 162° C.), polyimide (Mitsubishi gas chemical company's Neopulim: 260° C.), fluorene ring-modified polycarbonate (BCF-PC, compound described in JP-A 2000-227603: 225° C.), alicyclic-modified polycarbonate (IP-PC, compound described in JP-A 2000-227603: 205° C.), acryloyl compound (compound described in JP-A 2002-80616: 300° C. or more) (the parenthesized data are Tg). In particular, for high transparency, use of alicyclic polyolefin is preferred.

The thickness of the substrate film used in the invention is appropriately chosen depending on its use and is not specifically limited. In the invention, may be used a thin film having a thickness of about 1 to 25 µm or a thick film having a thickness of about 30 to 300 µm.

In the substrate film in the invention, fine particles as a matting agent may be dispersed. The film satisfying Ra and Rz as above-mentioned is readily obtained by having the fine particles dispersed thereon. Examples of such fine particles include silicon oxide, titanium oxide and zirconium oxide, and preferable is silicon oxide. Particularly, the substrate film having silicon oxide dispersed improves the coatability in the case of using the polymerizable composition comprising the above mentioned polyfunctional (meth)acrylate having an aromatic carbon skeleton.

The substrate film in the invention may comprise fine particles in addition to the above fine particles as a colorant or as an agent combining a colorant and a matting agent. Examples thereof include carbon black and titanium oxide. By adding the colorant into the substrate film, the substrate film can be used as the outermost layer of the back sheet of a solar cell.

(Inorganic Layer)

The inorganic layer is, in general, a layer of a thin film formed of a metal compound. The inorganic layer is preferably formed by a vacuum deposition method or a plasma assisted-deposition method, and more preferably a vacuum deposition method. The plasma assisted-deposition method includes a method comprising ionizing a material to be deposited by plasma to carry out the deposition, or a method comprising irradiating gas ion from an ion source which is separately provided. By forming the inorganic layer by such methods, it makes possible to form a dense film at high speed.

The inorganic layer in the invention comprises silicon oxide represented by SiOx, wherein x is in a range from 0.9 to 1.5, preferably in a range from 1.1 to 1.3. Using of such silicon oxide in wrapping material or optical material tended to be avoided since the film to be formed becomes ginger. However, when such silicon oxide is used in the invention, it has been found that high barrier property is achieved. The other component to be added in the inorganic layer is not specifically defined without diverting the scope of the invention, however, it is exemplified by metal oxide, metal nitride, metal carbide, metal oxynitride and metal oxycarbide. Preferably it is oxide, nitride, carbide, oxynitride or oxycarbide comprising one or more kinds of metals selected from Al, In, Sn, Zn, Ti, Cu, Ce and Ta. Of those, oxide, nitride or oxynitride of a metal selected from Al, In, Sn, Zn and Ti is preferable, oxide, nitride or oxynitride of Al is more preferable, and oxide of Al is further more preferable. The inorganic layer may contain another element in addition to the above elements as a subsidiary element.

The surface of the inorganic layer preferably satisfies each of the following formulae;

$$20 \text{ nm} < Ra(100 \text{ }\mu\text{m square}) < 40 \text{ nm}$$

$$0.5 \text{ nm} < Ra(10 \text{ }\mu\text{m square}) < 2.0 \text{ nm}$$

$$400 \text{ nm} < Rz(100 \text{ }\mu\text{m square}) < 700 \text{ nm}$$

It is desirable that the inorganic layer is formed in a clean room. Preferably, the degree of cleanness is not more than class 10000, more preferably not more than class 1000.

Not specifically defined, the thickness of the inorganic layer is generally within a range of from 5 to 500 nm/layer, preferably from 10 to 200 nm/layer. The inorganic layer may be a laminate composed of a plurality of sub-layers. In this case, each sub-layer may have the same composition, or a different composition.

On the inorganic layer, a protective layer such as an overcoat layer may be provided.

The inorganic layer may be provided on one side of the substrate film, or may be provided on the both sides of the substrate film. In addition, in the case where metal oxide and/or non-metal inorganic oxide which are used for the deposition are used as a mixture of two or more kinds thereof, the deposited film composed of different components can be formed.

(Composite Film)

While the laminate film of the invention may be used as it is, the laminate film of the invention is preferably used as a composite film in which two of the laminate films are stuck to each other with an adhesive layer so that the sides in which the inorganic layer is provided face each other. In the case of laminating them, the laminate films are stuck together by known laminating methods such as a dry laminate method, an extrusion laminate method, and a thermal lamination method. Hereinafter, the composite film is described in detail. FIG. 1 is a diagrammatic illustration showing that two laminate films 1 are stuck to each other using adhesive to form a composite film 6, wherein 1 represents a laminate film, 2 represents a substrate film, 3 represents an organic layer, and 4 represents an inorganic layer. The two laminate films are provided so that the sides in which the inorganic layer is provided face each other through an adhesive layer 5. When the substrate of the laminate film is thin, warpage tends to occur in the laminate film during the coating or depositing. However, the composite film is preferable since the laminate film balances the facing laminate film even if the warpage occurs. In addition, the inorganic layer surface in the laminate films can be protected.

The adhesive layer is a layer comprising an adhesive as a main ingredient, and the adhesive generally occupies 70% by weight of the adhesive layer, preferably 80 to 90% by weight of the adhesive layer. Various known adhesives may be used as the adhesive, and preferably a urethane series adhesive. The urethane series adhesive is exemplified by a thermal curing adhesive and a UV curing adhesive. In the case where the laminate film absorbs UV, the thermal curing adhesive is preferable. The thermal curing adhesive includes one liquid type and two liquids type, and both types are preferably used in the invention. In the invention, an adhesive which becomes transparent after curing is preferable. Examples of the commercial adhesive include Seika bond E series manufactured by Dainichiseika Color & Chemicals and DICDRY LX series manufactured by DIC. In addition, a silane coupling agent is preferably added into the adhesive. By adding the silane coupling agent, the adhesion force is effectively enhanced. Into the adhesive, additives such as an ultraviolet absorber, a light stabilizer, an inorganic filler and a colorant may be added to extent that the adhesive property is not changed. The adhesive layer is formed by coating the adhesive by a coating method such as a roll coating method, a gravure coating method, a kiss coating method, a bar coating method and other known coating methods.

(Functional Layer)

The laminate film and the composite film of the invention may have a functional layer on the barrier layer or the like without diverting the scope of the invention. The functional layer is described in detail in JP-A 2006-289627, paragraphs 0036 to 0038.

Examples of other functional layers than those include a matting agent layer, a protective layer, a solvent resistance layer, an antistatic layer, a planarizing layer, an adhesiveness improving layer, a light shielding layer, an antireflection layer, a hard coat layer, a stress relaxing layer, an antifogging layer, an anti-soiling layer, a printable layer, an easy adhesive layer, etc.

(Solar Cell)

Figure 2:
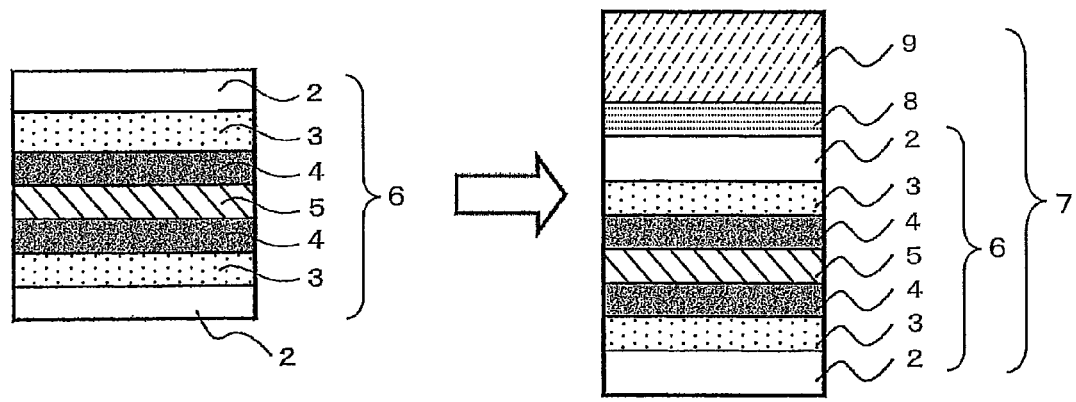
FIG. 2 is a diagrammatic illustration showing an example applying the composite film to a back sheet for a solar cell, wherein 7 is a back sheet for a solar cell, 8 is an adhesive layer and 9 is a plastic film.

The laminate film and the composite film of the invention, especially the composite film, can be used for a sheet for solar cell devices. The sheet for solar cell devices may be a front sheet or back sheet, and preferably is a back sheet. FIG. 2 is a diagrammatic illustration showing an example in which the composite film of the invention is applied to a back sheet of a solar cell device, wherein 6 shows the composite film and 7 shows the back sheet for a solar cell. In the back sheet for a solar cell 7, the upper side corresponds to the upper side of the solar cell and the down side corresponds to the down side of the solar cell. The substrate film 2 which is at the upper side of the composite film 6 may optionally be stuck to a plastic film 9 with an adhesive layer 8. For example, it may be possible to form the embodiment wherein the substrate film 2 includes white pigment and, in order to enhance the insulation property to the substrate film, the plastic film 9 as a transparent film is adhered to the substrate film 2. The plastic film 9 adheres to the substrate film in the embodiment, however, it may be possible to omit the plastic film 9 by increasing the thickness of the substrate film 2 and adding a colorant into the substrate film. Thus, the embodiment in which the substrate film includes a colorant is preferably exemplified. On the other hand, the substrate film 2 which is used for a part corresponding to the back side of the solar cell preferably has weatherability, or the substrate film 2 may adhere to a film comprising a resin having weatherability, such as polyvinyl fluoride for the purpose of improving the weatherability of the substrate film 2.

A solar cell device is provided between a back sheet such as mentioned above and a front sheet for a solar cell. The solar cell devices preferably applicable to the back sheet of the invention are not specifically limited. For example, they include single crystal silicon-based solar cell devices, polycrystalline silicon-based solar cell devices, single-junction or tandem-structure amorphous silicon-based solar cell devices, gallium-arsenic (GaAs), indium-phosphorus (InP) or the like III-V Group compound semiconductor-based solar cell devices, cadmium-tellurium (CdTe) or the like II-VI Group compound semiconductor-based solar cell devices, copper/indium/selenium (CIS-based), copper/indium/gallium/selenium (CIGS-based), copper/indium/gallium/selenium/sulfur (CIGSS-based) or the like I-III-VI Group compound semiconductor-based solar cell devices, dye-sensitized solar cell devices, organic solar cell devices, etc. Above all, in the invention, the solar cell devices are preferably copper/indium/selenium (CIS-based), copper/indium/gallium/selenium (CIGS-based), copper/indium/gallium/selenium/sulfur (CIGSS-based) or the like I-III-VI Group compound semiconductor-based solar cell devices.

EXAMPLES

The characteristics of the invention are described more concretely with reference to the following Examples. In the following Examples, the material used, its amount and the ratio, the details of the treatment and the treatment process may be suitably modified or changed not overstepping the sprit and the scope of the invention. Accordingly, the invention should not be limitatively interpreted by the Examples mentioned below.

1. Formation of Laminate Film

On the surface of a polyethylene terephthalate film (PET film, having thickness of 12 µm, Rumilar S10 manufactured by TORAY), an organic layer and an inorganic layer were formed in the following procedure. The obtained laminate film was measured and evaluated.

(1) Formation of the First Layer (Organic Layer)

On the surface of the PET film, a polymerizable composition consisting of 18 parts by weight of the polymerizable compounds having a composition shown in the following table (one of Compound A, Compound B and Compound C), 2 parts by weight of silane coupling agent (Compound S), 0.6 parts by weight of UV initiator (Ezacure KTO46 manufactured by Lambertis), and 190 parts by weight of 2-butanone was coated by bar coating method, and then put into a chamber having an oxygen concentration of 0.1% after nitrogen substitution, and the organic layer was cured therein through irradiation with UV light from a high-pressure mercury lamp (integrated radiation, about 1 J/cm$^2$), thereby constructing an organic layer having a thickness of 300 to 2500 nm±50 nm.

(2) Formation of the Second Layer (Inorganic Layer)

Using a vacuum deposition apparatus, an inorganic layer (silicon oxide) was formed on the surface of the organic layer. Using SiO as a depositing material, the silicon oxide layer was formed by EB deposition method in which irradiation of electric beam is carried out by electron gun. The formation pressure was 0.003 Pa. The thickness was 80 nm. It was found to be $SiO_x(X=1.1)$ from the results of XPS measurement. Thus, the inorganic layer was formed on the surface of the organic layer to form a laminate film. Concerning Comparative 4, it was prepared so as to be x=1.7.

The characteristic value of the obtained laminate films (Smoothness (Ra and Rz) and Waver vapor permeability) are shown in the following Tables 1 and 2.

<Measurement of Smoothness of PET Film (Ra and Rz)>

Using an atom force microscope, the Smoothness of the PET film used in the above was measured. The measurement was followed by the following conditions, and repeated five times on the same face to calculate an average value thereof.

Apparatus: scanning atomic force microscope (AFM) (manufactured by Seiko Instruments Inc., type: SPI-3800N)

Scanning frequency: 1.00 Hz

Area: 100000 nm

The number of X data: 256

The number of Y data: 256

The smoothness was measured and evaluated by the following;

an arithmetic average roughness on a surface having 100 μm square to be measured: Ra (100 μm square), and a ten-point average roughness on a surface having 100 μm square to be measured: Rz (100 μm square).

<Measurement of Smoothness of Organic Layer (Ra and Rz)>

The smoothness of the surface of the organic layer as formed above was measured using an atom force microscope. The measurement for 100 μm square was carried out according to the above condition. The measurement for 10 μm square was carried out according to the above condition except that the area was changed to 10000 nm. The measurement was carried out at five-points on the same face and the average thereof was calculated. The smoothness was measured and evaluated by the following;

an arithmetic average roughness on a surface having 10 μm square to be measured: Ra (10 μm square), an arithmetic average roughness on a surface having 100 μm square to be measured: Ra (100 μm square), and a ten-point average roughness on a surface having 100 μm square to be measured: Rz (100 μm square).

<Measurement of Water Vapor Permeability by MOCON Method (WVTR)>

Using a water vapor permeability apparatus (manufactured by MOCON, PERMATRAN-WR3/33 series G type), the water permeability (g/m²/day) was measured. The measurement was carried out at 40° C. and at the relative humidity of 90%.

<Evaluation of Smoothness>

Each of the laminate films consisting of the PET film, the organic layer on the PET film, and the inorganic layer on the organic film was transferred by roll to roll processing, and then, confirmed whether wrinkle occurred or not. The occurrence was shown as ○ and the non-occurrence was shown as ×.

TABLE 1

| | PET Film | | Organic Layer | | |
|---|---|---|---|---|---|
| | Sort | Thickness [μm] | Polymerizable compound | Thickness [μm] | Inorganic Layer |
| Example 1 | TORAY Rumilar S10 | 12 | A + S | 0.5 | SiOx  X = 1.1 |
| Example 2 | TORAY Rumilar S10 | 12 | A + S | 1 | SiOx  X = 1.1 |
| Example 3 | TORAY Rumilar S10 | 12 | A + S | 2 | SiOx  X = 1.1 |
| Example 4 | TORAY Rumilar T11 | 25 | A + S | 1.5 | SiOx  X = 1.1 |
| Example 5 | TORAY Rumilar S10 | 12 | B + S | 1 | SiOx  X = 1.1 |
| Example 6 | TORAY Rumilar S10 | 12 | C + S | 1 | SiOx  X = 1.1 |
| Example 7 | TORAY Rumilar S10 | 12 | A | 1 | SiOx  X = 1.1 |
| Example 8 | White PET (by FUJI Film) | 175 | A | 1.8 | SiOx  X = 1.1 |
| Comp. Ex. 1 | TORAY Rumilar S10 | 12 | A + S | 0.3 | SiOx  X = 1.1 |
| Comp. Ex. 2 | TORAY Rumilar S10 | 12 | A + S | 2.5 | SiOx  X = 1.1 |
| Comp. Ex. 3 | TORAY Rumilar S10 | 12 | B + S | 0.5 | SiOx  X = 1.1 |
| Comp. Ex. 4 | TORAY Rumilar S10 | 12 | A + S | 1 | SiOx  X = 1.7 |

TABLE 2

| | Smoothness | | | | | | |
|---|---|---|---|---|---|---|---|
| | PET Film | | Organic Layer | | | | |
| | Ra 100 μm Square | Rz 100 μm Square | Ra 100 μm Square | Rz 100 μm Square | Ra 10 μm Square | WVTR (g/m²/day) | Smoothness |
| Example 1 | 27 | 580 | 29 | 238 | 0.432 | 0.012 | ○ |
| Example 2 | | | 14.3 | 201 | 0.61 | 0.016 | ○ |
| Example 3 | | | 20.1 | 101 | 0.525 | 0.016 | ○ |
| Example 4 | 19.9 | 882 | 15.2 | 230 | 0.447 | 0.012 | ○ |
| Example 5 | 27 | 580 | 13.1 | 222 | 0.44 | 0.02 | ○ |
| Example 6 | | | 18.8 | 182 | 0.511 | 0.016 | ○ |
| Example 7 | | | 14.7 | 203 | 0.578 | 0.02 | ○ |
| Example 8 | 64.3 | 1122 | 13.3 | 251 | 0.623 | 0.02 | ○ |
| Comp. Ex. 1 | 27 | 580 | 35.5 | 323 | 0.553 | 0.32 | ○ |
| Comp. Ex. 2 | | | 21.9 | 60.3 | 0.497 | 0.02 | × |
| Comp. Ex. 3 | | | 35.4 | 352 | 2.21 | 0.44 | ○ |
| Comp. Ex. 4 | | | 14.3 | 201 | 0.61 | 0.6 | ○ |

The compounds used above are as follows;

Compound A:

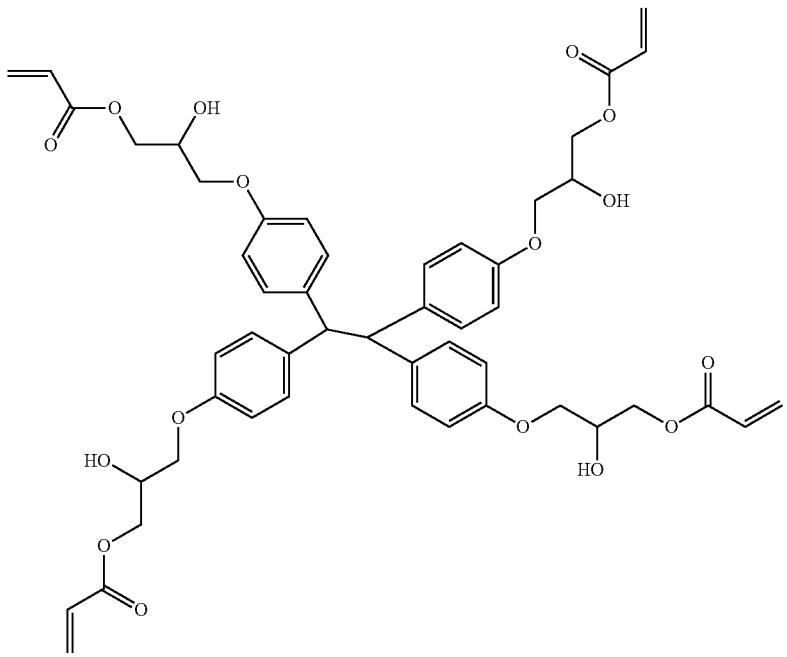

Compound B: Light acrylate TMP-A manufactured by Kyoeisha Chemical Co.,
Compound C: Bisphenol A type epoxy acrylate, VR-60 (manufactured by Showa Highpolymer Co., LTD.)
Compound S: KBM5103 manufactured by Shin-Etsu As is clear from the above tables, all of the laminate films of the invention have the vapor water permeability of 0.005 g/m²/day or less. Each of the inorganic layers of the invention attained high smoothness. It was found that superior barrier property was attained by using a bifunctional (meth)acrylate having an polycyclic aromatic skeleton as a material of the organic layer.

2. Formation of Multilayered-Laminate Film.

Each of multilayered-laminate films was formed by the same method as the above 1, except that two of the organic layers and two of the inorganic layers were formed. It was found that the barrier property of those multilayered-laminate films was improved compared with that corresponding to the laminate films as formed in the above 1, respectively.

3. Formation of Composite Film

Two of the laminate films as formed in the above 1 were adhered to each other so that the inorganic layers face inside, to thereby form a composite film. It was found that the barrier property of those composite films was further improved compared with that of the corresponding single laminate films, respectively.

Formation of Solar Cell

Using the laminate films as formed in the above 1, each of solar cell modules was manufactured. As filler for a solar cell module, standard cure type of ethylene-vinyl acetate copolymer was used. On the surface of a strengthen glass having a 10 cm square, a solar cell of amorphous series silicone was sandwiched by ethylene-vinyl acetate copolymer films having a thickness of 450 µm, and then, on the surface thereof, the above laminate film was provided to form a solar cell module. The solar cell module was set up by vacuuming it at 150° C. for 3 minutes and pressuring it for 9 minutes. The solar cell module as formed by the method worked properly and kept good electric generating power property even if used at 85° C. and 85% RH.

The laminate film of the invention is excellent in barrier property and is easy to be formed since it can be formed by roll to roll processing. Thus, the laminate film of the invention is preferably used for a sheet for a solar cell, especially as a back sheet for a solar cell.

The present disclosure relates to the subject matter contained in Japanese Patent Application No. 195234/2009 filed on Aug. 26, 2009, which is expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A laminate film comprising a substrate film, an organic layer and an inorganic layer in that order, wherein the organic layer has a thickness of 300 nm to 2000 nm, the inorganic layer comprises silicon oxide represented by SiOx, wherein x is in a range from 0.9 to 1.5, and the organic layer has a surface satisfying all the following formulae;

$$Ra(100 \text{ µm square}) < 50 \text{ nm}$$

$$Ra(10 \text{ µm square}) < 2 \text{ nm}$$

$$75 \text{ nm} < Rz(100 \text{ µm square}) < 300 \text{ nm}.$$

2. The laminate film according to claim 1, wherein the substrate film has a surface satisfying all the following formulae;

Ra(100 μm square)<50 nm 300 nm<Rz(100 μm square)<1200 nm.

3. The laminate film according to claim 1, wherein the organic layer is obtained by curing a polymerizable composition comprising a (meth)acrylate.

4. The laminate film according to claim 1, wherein the organic layer is obtained by curing a polymerizable composition comprising a polyfunctional (meth)acrylate.

5. The laminate film according to claim 1, wherein the organic layer is obtained by curing a polymerizable composition comprising a polyfunctional (meth)acrylate having an aromatic carbon skeleton.

6. The laminate film according to claim 1, wherein the substrate film comprises fine particles dispersed therein.

7. The laminate film according to claim 1, wherein the substrate film comprises a colorant.

8. The laminate film according to claim 1, wherein the organic layer comprises a silane coupling agent.

9. The laminate film according to claim 1, wherein the inorganic layer comprises silicon oxide and/or aluminium oxide.

10. The laminate film according to claim 1, wherein the inorganic layer is a layer formed by a vacuum deposition method.

11. The laminate film according to claim 1, wherein the organic layer has a thickness of 300 nm to 2000 nm.

12. The laminate film according to claim 1, wherein the inorganic layer has a thickness of 5 nm to 500 nm.

13. The laminate film according to claim 1, wherein the organic layer is obtained by curing a polymerizable composition comprising a polyfunctional (meth)acrylate having an aromatic carbon skeleton selected from benzene skeleton, biphenyl skeleton, naphthalene skeleton, binaphthyl skeleton, azulene skeleton, biphenylene skeleton, acenaphthylene skeleton, phenanthrene skeleton, anthracene skeleton, triphenylene skeleton, pyrene skeleton, chrysene skeleton, naphthacene skeleton, picene skeleton, perylene skeleton, and benzopyrene skeleton.

14. The laminate film according to claim 1, wherein the inorganic layer has a surface satisfying all the following formulae;

20 nm<Ra(100 μm square)<40 nm 0.5 nm<Ra(10 μm square)<2.0 nm 400 nm<Rz(100 μm square)<700 nm.

15. The laminate film according to claim 6, wherein the fine particles comprise one or more kinds selected from silicon oxide, titanium oxide and zirconium oxide.

16. The laminate film according to claim 6, wherein the fine particles comprise carbon black.

17. A composite film comprising two laminate films each comprising a substrate film, an organic layer and an inorganic layer in that order, wherein the laminate films adhere to each other at a side of its inorganic layer, and the laminate films each satisfy as follows;

the organic layer has a thickness of 300 nm to 2000 nm,
the inorganic layer comprises silicon oxide represented by SiOx, wherein x is in a range from 0.9 to 1.5, and
the organic layer has a surface satisfying all the following formulae;

Ra(100 μm square)<50 nm

Ra(10 μm square)<2 nm 75 nm<Rz(100 μm square)<300 nm.

18. The composite film according to claim 17, wherein the laminate films adhere to each other with an adhesive layer.

19. A back sheet for a solar cell comprising a laminate film comprising a substrate film, an organic layer and an inorganic layer in that order, wherein the organic layer has a thickness of 300 nm to 2000 nm, the inorganic layer comprises silicon oxide represented by SiOx, wherein x is in a range from 0.9 to 1.5, and the organic layer has a surface satisfying all the following formulae;

Ra(100 μm square)<50 nm

Ra(10 μm square)<2 nm 75 nm<Rz(100 μm square)<300 nm.

20. A method for producing a laminate film comprising a substrate film, an organic layer and an inorganic layer in that order, wherein the organic layer has a thickness of 300 nm to 2000 nm, the inorganic layer comprises silicon oxide represented by SiOx, wherein x is in a range from 0.9 to 1.5, and the organic layer has a surface satisfying all the following formulae;

Ra(100 μm square)<50 nm

Ra(10 μm square)<2 nm 75 nm<Rz(100 μm square)<300 nm, and which comprises transferring the substrate film by roll to roll processing.

* * * * *